(12) United States Patent
Andle

(10) Patent No.: US 11,313,895 B2
(45) Date of Patent: Apr. 26, 2022

(54) ANTENNA CONNECTIVITY WITH SHIELDED TWISTED PAIR CABLE

(71) Applicant: Rosemount Inc., Shakopee, MN (US)

(72) Inventor: Jeffrey C. Andle, Rockledge, FL (US)

(73) Assignee: ROSEMOUNT INC., Shakopee, MN (US)

( * ) Notice: Subject to any disclaimer, the term of this patent is extended or adjusted under 35 U.S.C. 154(b) by 171 days.

(21) Appl. No.: 16/580,251

(22) Filed: Sep. 24, 2019

(65) Prior Publication Data

US 2021/0088572 A1 Mar. 25, 2021

(51) Int. Cl.
| | | |
|---|---|---|
| G01R 31/12 | (2020.01) | |
| G01R 31/08 | (2020.01) | |
| H04B 7/02 | (2018.01) | |
| H01B 7/17 | (2006.01) | |
| H01B 11/06 | (2006.01) | |

(52) U.S. Cl.
CPC ....... G01R 31/1272 (2013.01); G01R 31/086 (2013.01); H01B 7/17 (2013.01); H01B 11/06 (2013.01); H04B 7/02 (2013.01)

(58) Field of Classification Search
CPC ................ G01R 31/12; G01R 31/1272; G01R 29/0878; G01R 31/086; H01B 11/06; H01B 11/02; H01B 7/0876; H04B 7/02
See application file for complete search history.

(56) References Cited

U.S. PATENT DOCUMENTS

| | | |
|---|---|---|
| 3,938,034 A | 2/1976 | Japenga |
| 4,904,996 A | 2/1990 | Fernandes |
| 4,937,763 A | 6/1990 | Mott |
| 5,063,931 A | 11/1991 | Leavitt |
| 5,602,709 A | 2/1997 | Al-Dabbagh |
| 5,612,930 A | 3/1997 | Hazony et al. |
| 5,815,352 A | 9/1998 | Mackenzie |
| 5,933,012 A | 8/1999 | Bengtsson et al. |

(Continued)

FOREIGN PATENT DOCUMENTS

| | | |
|---|---|---|
| CA | 2 192 856 | 9/2000 |
| CA | 2 455 206 | 5/2012 |

(Continued)

OTHER PUBLICATIONS

"Partial Discharge Theory and Applicants to Electrical Systems", by G. Paoletti et al., IEEE IAS Pulp and Paper Industry Conference in Seattle, WA, 1999.

(Continued)

*Primary Examiner* — Son T Le
(74) *Attorney, Agent, or Firm* — Westman, Champlin & Koehler, P.A

(57) ABSTRACT

A sensor system for an electric power asset includes a sensor instrument coupleable to sensors associated with the electric power asset to receive sensor signals therefrom, and an antenna connection cable coupled to the sensor instrument. The antenna connection cable includes a cable sheath and a plurality of twisted pair signal carriers contained within the cable sheath to carry sensor signals received from the electric power asset. A first subset of the plurality of twisted pair signal carriers carry antenna signals and a second separate subset of the plurality of twisted pair signal carriers carry signals for partial discharge monitoring.

15 Claims, 6 Drawing Sheets

(56) References Cited

U.S. PATENT DOCUMENTS

| | | |
|---|---|---|
| 6,002,260 A | 12/1999 | Lau et al. |
| 6,124,680 A | 9/2000 | Shoji et al. |
| 6,172,862 B1 | 1/2001 | Jonnatti et al. |
| 6,297,642 B1 | 10/2001 | Shibahara et al. |
| 6,424,162 B1 | 7/2002 | Rokunohe et al. |
| 6,483,316 B2 | 11/2002 | Kato et al. |
| 6,577,138 B2 | 6/2003 | Zuercher et al. |
| 6,774,639 B1 | 8/2004 | Unsworth |
| 7,071,701 B2 | 7/2006 | Roman et al. |
| 7,577,535 B2 | 8/2009 | Anderson et al. |
| 7,676,333 B2 | 3/2010 | Younsi et al. |
| 7,912,660 B2 | 3/2011 | Anderson et al. |
| 8,271,213 B2 | 9/2012 | Xu et al. |
| 8,466,690 B2 | 6/2013 | Stewart et al. |
| 8,929,036 B2 | 1/2015 | Nayak et al. |
| 9,322,881 B2 | 4/2016 | Sakurai et al. |
| 9,372,221 B1 | 6/2016 | Bierman |
| 9,383,402 B2 | 7/2016 | Fukasawa et al. |
| 9,733,285 B2 | 8/2017 | Kennedy et al. |
| 9,753,080 B2 | 9/2017 | Andle et al. |
| 10,379,151 B2 | 8/2019 | Daoudi et al. |
| 10,444,273 B2 | 10/2019 | Ikegami et al. |
| 2003/0093390 A1 | 5/2003 | Onoda et al. |
| 2004/0109269 A1 | 6/2004 | Kawate et al. |
| 2004/0193303 A1 | 9/2004 | Fore, Sr. et al. |
| 2005/0035768 A1 | 2/2005 | Rabach et al. |
| 2005/0194979 A1 | 9/2005 | Roman et al. |
| 2006/0095220 A1 | 5/2006 | Vrba et al. |
| 2007/0059986 A1 | 3/2007 | Rockwell |
| 2007/0121261 A1 | 5/2007 | Sung |
| 2007/0272827 A1 | 11/2007 | Heo et al. |
| 2008/0133154 A1 | 6/2008 | Krauss |
| 2008/0204950 A1 | 8/2008 | Zhou et al. |
| 2008/0309351 A1 | 12/2008 | Steward et al. |
| 2009/0119035 A1 | 5/2009 | Younsi et al. |
| 2009/0251308 A1 | 10/2009 | Schweitzer, III et al. |
| 2010/0072355 A1 | 3/2010 | Schweitzer, III et al. |
| 2010/0114392 A1 | 5/2010 | Lancaster |
| 2010/0271152 A1 | 10/2010 | Sabah et al. |
| 2010/0315065 A1* | 12/2010 | Durston ............... H04M 3/306 324/126 |
| 2011/0234215 A1 | 9/2011 | Ausserlechner |
| 2011/0234362 A1 | 9/2011 | Koehler et al. |
| 2011/0249370 A1 | 10/2011 | Nayak et al. |
| 2012/0134058 A1 | 5/2012 | Pamer et al. |
| 2012/0185185 A1 | 7/2012 | Bae et al. |
| 2013/0039377 A1 | 2/2013 | Kagiwada et al. |
| 2013/0192376 A1 | 8/2013 | Zhou et al. |
| 2013/0226479 A1 | 8/2013 | Grosjean |
| 2013/0234726 A1 | 9/2013 | Hobelsberger |
| 2014/0270205 A1 | 9/2014 | Miller |
| 2014/0336479 A1 | 11/2014 | Ando |
| 2014/0347069 A1 | 11/2014 | Krumpholz et al. |
| 2015/0015303 A1 | 1/2015 | Sakurai et al. |
| 2015/0043310 A1 | 2/2015 | Maas et al. |
| 2015/0160098 A1 | 6/2015 | Noda et al. |
| 2015/0204936 A1 | 7/2015 | Fukasawa et al. |
| 2015/0253362 A1 | 9/2015 | Louzir et al. |
| 2015/0260778 A1 | 9/2015 | Park et al. |
| 2015/0301102 A1 | 10/2015 | Daoudi et al. |
| 2015/0317229 A1 | 11/2015 | Wada et al. |
| 2016/0003900 A1 | 1/2016 | Narayanan et al. |
| 2016/0116520 A1 | 4/2016 | De Stefano et al. |
| 2016/0161543 A1* | 6/2016 | Andle ............... G01R 31/1272 324/551 |
| 2016/0209454 A1 | 7/2016 | McCammon et al. |
| 2016/0209459 A1 | 7/2016 | Tozzi et al. |
| 2016/0231375 A1 | 8/2016 | Roemer et al. |
| 2017/0038424 A1 | 2/2017 | Ikegami et al. |
| 2017/0074920 A1* | 3/2017 | Di Stefano ............ G01R 31/16 |
| 2017/0168024 A1* | 6/2017 | Dehghan Niri .... G01N 29/2418 |
| 2017/0193252 A1 | 7/2017 | Ehrhardt et al. |
| 2018/0062003 A1 | 3/2018 | Luan et al. |
| 2018/0097531 A1* | 4/2018 | Kummaraguntla .. H04B 1/0483 |
| 2018/0114688 A1 | 4/2018 | Qian |
| 2018/0115144 A1 | 4/2018 | Murnane |
| 2018/0159310 A1 | 6/2018 | Yang |
| 2018/0252760 A1 | 9/2018 | Andle et al. |
| 2018/0356357 A1 | 12/2018 | Samarao |
| 2019/0250198 A1 | 8/2019 | Kubena et al. |
| 2019/0383872 A1 | 12/2019 | Andle et al. |

FOREIGN PATENT DOCUMENTS

| | | |
|---|---|---|
| CA | 2 821 795 | 7/2012 |
| CN | 1407345 | 4/2003 |
| CN | 102193052 | 9/2011 |
| CN | 203025311 | 6/2012 |
| CN | 102621377 | 8/2012 |
| CN | 202502197 | 10/2012 |
| CN | 102934308 | 2/2013 |
| CN | 103913663 | 7/2014 |
| CN | 104914358 | 9/2015 |
| CN | 106199362 | 12/2016 |
| CN | 205880182 | 1/2017 |
| CN | 106461721 | 2/2017 |
| CN | 106772170 | 5/2017 |
| CN | 107238811 | 10/2017 |
| CN | 211653042 | 10/2020 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 5-107301 | 4/1993 |
| JP | 3082132 | 8/2000 |
| JP | 2002-131366 | 5/2002 |
| JP | 2004-61358 | 2/2004 |
| JP | 2011-095036 | 5/2011 |
| JP | 4840050 | 12/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | WO 2014/189975 | 11/2014 |
| WO | WO 2017/029415 | 2/2017 |

OTHER PUBLICATIONS

"Advantages of Continuous Monitoring of Partial Discharges in Rotating Equipment and Switchgear", by C. Kane et al., 8 pgs.
"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andle et al., IEEE, 2015.
Oil, Gas, and Petrochemicals Users Group Meeting, 2012, 2 pgs.
Notification of Transmittal of the International Search Report and the Written Opinion of the International Searching Authority from PCT/US2018/020585, dated Jun. 25, 2018.
"Ubiquitous, On-Line, Partial Discharge Trending", by J. Andle et al., Electrical Insulation Conference (EIC) San Antonio, TX, Jun. 2018, IEEE, 6 pgs.
"Using Continuous Temperature Monitoring to Avoid Critical Asset Failure" by J. Andle et al., Electric Light & Power, Jul. 2015, 7 pgs.

(56) References Cited

OTHER PUBLICATIONS

"Partial Discharge Testing: A Progress Report" by V. Warren, PD Progress Report, IRMC 2013, 11 pgs.
"Ameren Illinois Smart Grid Test Bed Evaluation", by B. Snyder et al., Quanta Technology, LLC, 2017, 30 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al., Electrical Insulation Conference and Electrical Manufacturing & Coil Winding Conference, Oct. 1999.
Office Action from U.S. Appl. No. 14/961,321 dated Jan. 10, 2017.
Notification of Transmittal of the International Search Report and the Written Opinion of the International Searching Authority from PCT/US2018/057461, dated Apr. 18, 2019.
Notification of Transmittal of the International Search Report and the Written Opinion of the International Searching Authority from PCT/US2019/018392, dated Jun. 3, 2019.
Notification of Transmittal of the International Search Report and the Written Opinion of the International Searching Authority from International Application No. PCT/US2019/027669, dated Jul. 23, 2019.
Communication from European Patent Application No. 18712051.4, dated Sep. 18, 2019.
Office Action from Chinese Patent Application No. 201920428356.3, dated Nov. 7, 2019.
Notification of Transmittal of the International Search Report and the Written Opinion of the International Searching Authority from International Application No. PCT/US2019/053726, dated Dec. 17, 2019.
Office Action from U.S. Appl. No. 16/227,478, dated Feb. 5, 2020.
Office Action (including translation) from Chinese Application No. 201920428356.3, dated Apr. 10, 2020.
Office Action from Chinese Patent Application No. 201880000347.2, dated May 28, 2020 including partial translation.
Office Action from Chinese Patent Application No. 201880000347.2, dated Feb. 2, 2021, English Summary.
Office Action from Chinese Patent Application No. 201910256390.1, dated Apr. 2, 2021.
Office Action from U.S. Appl. No. 16/232,194, dated Apr. 27, 2021.
Office Action from Chinese Patent Application No. 201910256390.1, dated Aug. 12, 2021.
Office Action from Chinese Patent Application No. 201880000347.2, dated Aug. 4, 2021.
Office Action from U.S. Appl. No. 15/910,106, dated Jul. 27, 2021.

\* cited by examiner

ANTENNA CONNECTIVITY WITH SHIELDED TWISTED PAIR CABLE

FIELD

The present disclosure relates generally to radio frequency antenna connectivity, and more specifically, to use of shielded twisted pair cabling to carry multiple antenna signals including partial discharge monitoring signals for electric power assets.

BACKGROUND

Antenna connections typically use coaxial cable. In a coaxial cable, the outer conductor is typically connected to a case ground. For coaxial cable, the outer conductor of the cable is effectively an antenna when common mode signals are present. This antenna injects common mode signals into a system and can lead to problems with radio frequency interference (RFI). Therefore, coaxial cables have a poor common mode RFI immunity. This RFI is typically high when the environment involves high amounts of interference, especially those running motors, generators, and fast switching circuits. In addition to RFI, coaxial cables also transmit common mode signals and some reflected signals from poorly connected equipment or antennas, causing problems with electromagnetic radiated emissions compliance.

For example, wireless sensor systems used for sensing in electric power systems have a noise floor that is limited by common mode RFI injection. For the cable lengths used in electric power assets, the outer conductor of coaxial cable acts as a common mode antenna, leading to additional problems with RFI. Common mode signals are very common when cables connect different pieces of equipment in power plants and other electric power applications.

Electric power assets are often monitored for partial discharge. Partial discharge events may be determined in a variety of ways, including on UHF channels for detection. Such partial discharge becomes very difficult to detect above the noise floor, which is affected negatively by the poor common mode RFI immunity of coaxial cables, and the operation of the outer conductor of such cables as an antenna injecting common mode signals into the system. Electric power assets are also often monitored for the temperature of high voltage conductors using passive, wireless sensors. Passive, wireless, surface acoustic wave (SAW) sensors benefit from extremely low noise floors and would benefit from the improved RFI immunity of such cables. Silicon RFID sensors benefit from high effective transmitter power that is needed to energize the RFID element without contact.

Coaxial cables also do not lend themselves to multiple sensor types within a sensor interface, or for the use of multiple feed points within an antenna.

SUMMARY

In one embodiment, a sensor system for an electric power asset includes a sensor instrument coupleable to sensors associated with the electric power asset to receive sensor signals therefrom, and an antenna connection cable coupled to the sensor instrument. The antenna connection cable includes a cable sheath and a plurality of twisted pair signal carriers contained within the cable sheath to carry sensor signals received from the electric power asset. A first subset of the plurality of twisted pair signal carriers carry antenna signals and a second separate subset of the plurality of twisted pair signal carriers carry signals for partial discharge monitoring.

Implementations may include one or more of the following features. The sensor system where the first subset of twisted pair signal carriers include balanced radio frequency antenna signals between an external instrument and an antenna of the electric power asset. The sensor system where the first subset of twisted pair signal carriers carries signals to allow diversity antenna operation between an external instrument and an antenna of the electric power asset. The sensor system where each of the first subset of twisted pair signal carriers carries a signal between an external instrument and a different feed point for an antenna of the electric power asset. The sensor system where each of the first subset of twisted pair signal carriers carries a signal between an external instrument and an antenna feeding a different frequency band for an antenna of the electric power asset. The sensor system where each of the first subset of twisted pair signal carriers carries a signal having a different polarization between an external instrument and an antenna of the electric power asset. The sensor system where each of the first subset of twisted pair signal carriers carries a signal using a different resonance for an antenna of the electric power asset. The sensor system where each of the first subset of twisted pair signal carriers carries a signal from a different type of radiator for an antenna of the electric power asset. The sensor system where the sensor instrument includes different coupler types for different connections to the electric power asset. The sensor system where at least one twisted pair of the second subset of twisted pair signal carriers carries a photodetection signal from a photoelectric partial discharge monitor of the electric power asset. The sensor system where at least one twisted pair of the second subset of twisted pair signal carriers carries an audio signal from a microphone-based partial discharge monitor of the electric power asset. The sensor system where at least one twisted pair of the second subset of twisted pair signal carriers carries a humidity signal. The sensor system where at least one twisted pair of the second subset of twisted pair signal carriers carries an ambient temperature signal.

In another embodiment, an antenna for an electric power asset includes an antenna connection cable coupled to a sensor instrument. The antenna connection cable includes a cable sheath and a plurality of twisted pair signal carriers contained within the cable sheath to carry sensor signals between the electric power asset and an external sensor interface. A first subset of the plurality of twisted pair signal carriers carries antenna signals and a second separate subset of the plurality of twisted pair signal carriers carry signals for partial discharge monitoring.

Implementations may include one or more of the following features. The antenna may be used with a sensor system for the electric power asset, including at least one integrated sensor for at least one of environmental signals and partial discharge monitoring of the electric power asset, said at least one integrated sensor interfaced to at least one of said twisted pairs. The integrated sensor further includes humidity or ambient temperature sensors, and the antenna connection cable carries humidity or ambient temperature signals of the humidity or ambient temperature sensors on individual twisted pairs of the second separate subset of the plurality of twisted pair signal carriers. The antenna where at least one twisted pair of the second subset of twisted pair signal carriers carries a photodetection signal from a photoelectric partial discharge monitor of the electric power asset. The antenna where at least one twisted pair of the second subset of twisted pair signal carriers carries an audio signal from a microphone-based partial discharge monitor of the electric power asset. The antenna further includes a sensor system for the electric power asset, including at least one integrated sensor for at least one of environmental signals and partial discharge monitoring of the electric power asset, the at least one integrated sensor communicating wirelessly using at least one antenna element coupled to at least one twisted pair. The antenna where the first subset of twisted pair signal carriers include balanced radio frequency antenna signals for the antenna of the electric power asset.

In another embodiment, a method of monitoring an electric power asset for partial discharge includes receiving partial discharge signals on a multiple-pair, shielded twisted pair cable having a plurality of twisted pair signal carriers. Receiving includes receiving partial discharge radio frequency emission signals on a first subset of the plurality of twisted pair signal carriers. The method of monitoring also includes transmitting control signals and receiving sensor signals for partial discharge monitoring on a second separate subset of the plurality of twisted pair signal carriers.

Implementations may include a method where transmitting antenna signals further includes transmitting balanced radio frequency antenna signals for an antenna of the electric power asset to allow diversity antenna operation for an antenna of the electric power asset.

DETAILED DESCRIPTION

Figure 1A:
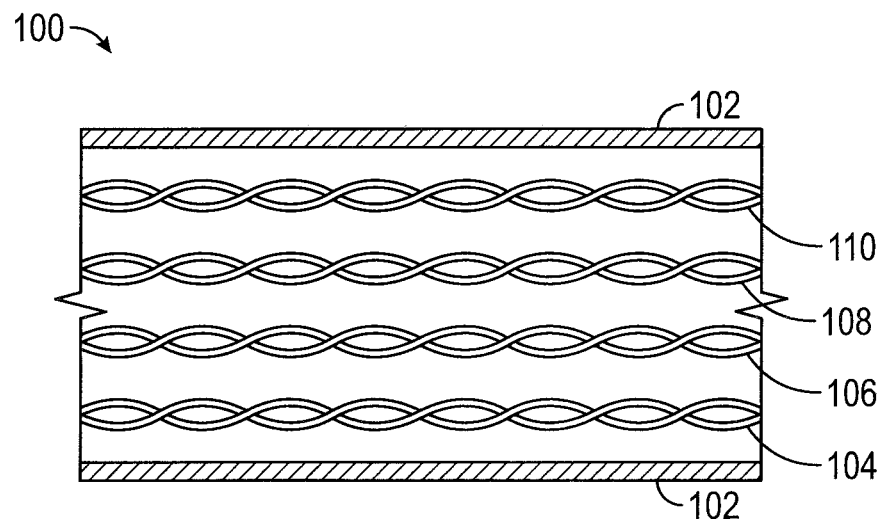
FIG. 1A is a cutaway view of a shielded twisted pair cable on which embodiments of the present disclosure may be practiced.

Embodiments of the present disclosure provide multiple-pair, shielded twisted pair (STP) cables, and a sensor suite, the sensor suite for monitoring sensors interrogated via antenna signals and for partial discharge monitoring of an electric power asset, either by antenna signals or by conductively coupled sensors. The sensor suite may include radio frequency antenna signals including using multiple feed points, different polarizations, and the like. The sensor suite may also include partial discharge detection sensors such as an ultraviolet photodiode and/or an ultrasonic microphone. All signals are carried in the single multiple-pair STP bundle. Antenna signals may be passively monitored for very high frequency (VHF) or ultrahigh frequency (UHF) partial discharge detection or may be transceiver signals for interrogation of passive, wireless sensors in the sensor suite.

Shielded twisted pair (STP) cables combine good RFI rejection with shielding that is not a part of the signal transmission path. This contrasts with coaxial cable. In addition, STP cable has a smaller signal loss than typical low-loss coaxial cables of similar cross-section. Crosstalk between twisted pairs in a multiple-STP cable is also small. Examples of STP that provide low loss and balanced signals within a shield that is not part of the transmission path include by way of example only and not by way of limitation, CAT7A and better STP cables.

STP cables allow for the use of multiple independent signals within a single cable, which is also not available using coaxial cabling. The ability to provide multiple radio frequency (RF) and broadband signals over a single cable improves partial discharge analysis within a system employing such cables.

STP cable offers transmission bandwidths exceeding 1 GHz with losses at 433 MHz that are more than 10% lower than low-loss coaxial cable of comparable per-signal cross-section. The reduced losses offer better noise figure and better sensitivity for small signal detection. They also offer increased radiated power under a given conducted power limitation and better read range for a passive, wireless sensor. The use of balun transformers at an instrument side of a cable run using twisted pair cabling provides a balanced line with significantly reduced common mode interference even without using a shield. Using a shield that is not a part of the transmission circuit further improves the reduction in common mode interference.

The comparatively low losses of shielded twisted pair cables can also offer lower noise figure (NF) and higher sensitivity for radio receivers, higher effective radiated power (ERP) under a given conducted power limitation, reduced spurious emissions levels from the cable, further read range, and better interrogation reliability for silicon RFID.

Shielded twisted pair cables allow a dense collection of multiple signal types, including radio transmitter, radio receiver, monostatic and bistatic radio transceivers, analog signals, and digital signals.

FIG. 1A is a block diagram showing a multiple-pair STP cable 100 showing unshielded twisted pairs 104, 106, 108, and 110, and having an outer foil cable shield 102. Such a multiple twisted pair cable is referred to as an F/UTP (foil outer/unshielded twisted pair) cable. CAT8/8.1 cables typically use F/UTP construction.

Figure 1B:
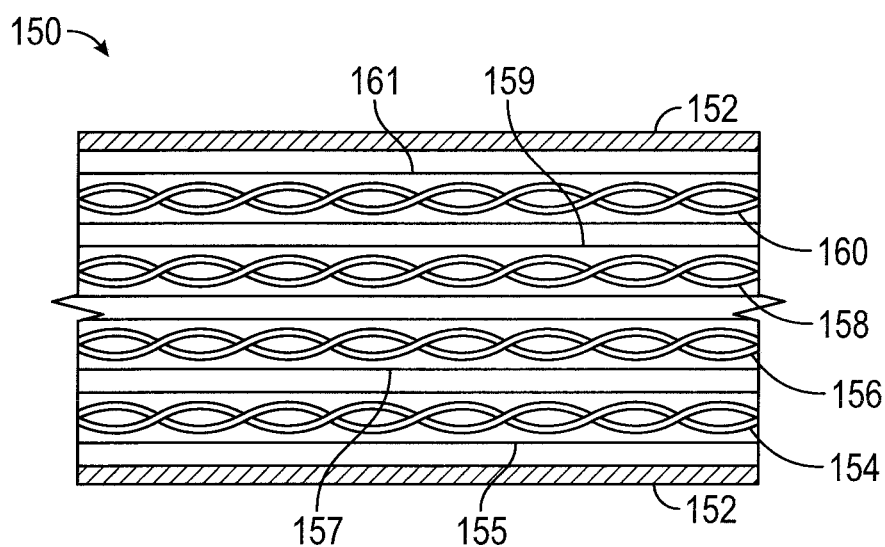
FIG. 1B is a cutaway view of another shielded twisted pair cable on which embodiments of the present disclosure may be practiced.

FIG. 1B is a block diagram a multiple-pair STP cable 150 showing twisted pairs 154, 156, 158, and 160 having foil shielding 155, 157, 159, 161, respectively, and having an outer braided cable shield 152. Such a multiple twisted pair cable is referred to as an S/FTP (braided shield outer/foil shielded twisted pair) cable. Cables in which the outer shield is foils are sometimes called F/FTP. CAT7A and CAT8.2 cables typically use S/FTP construction or F/FTP construction. Each of the cable types is suitable for use with embodiments of the present disclosure, provided the overall level of the cable is CAT7A or better. S/FTP cables are expected to better shield against cross-talk between pairs and offer pair to pair protection from certain high voltage transients of limited energy such as electrostatic discharge and electrical fast transients.

Such multiple-pair STP cables, in one embodiment of the present disclosure, allow an antenna for assets such as electric assets to use a single cable, while providing diversity antenna operation within the antenna connection cable. This significantly simplifies installation of sensor suites and reduces wiring mistakes. Such diversity antenna operation includes in one embodiment the use of multiple feed points that are independently connected. Such multiple feed points allow for improvement of overall bandwidth in one embodiment by having different feed points access different portions of the spectrum. Alternatively, the multiple pairs of the multiple-pair STP may be used to drive different polarizations electromagnetic waves, providing diversity properties to overcome standing wave nulls that are common in metal enclosed electric power assets. In yet another embodiment, one or more pairs of the STP cable may be used to carry alternate signals for use in partial discharge monitoring, such as ultraviolet photodiode signals of ultrasonic sensor signals. Such additional signals allow for a more complete sensor suite to be used in certain applications such as partial discharge monitoring, all within a single cable. In yet another embodiment, one or more pairs of the STP cable may be used to carry alternate signals for monitoring ambient conditions such as air temperature and humidity.

The use of STP cables having multiple twisted pairs allows for the alternate sensor signals to be electrically isolated from the antenna. STP has very good electromagnetic compatibility properties. Therefore, line to line protection, which is required in some application, may be performed to reduced levels or even eliminated within the STP. Further, line to earth common mode surge requirements are also reduced, in one embodiment to half that of asymmetric lines in standards such as IEC61000-6-5.

Figure 2:
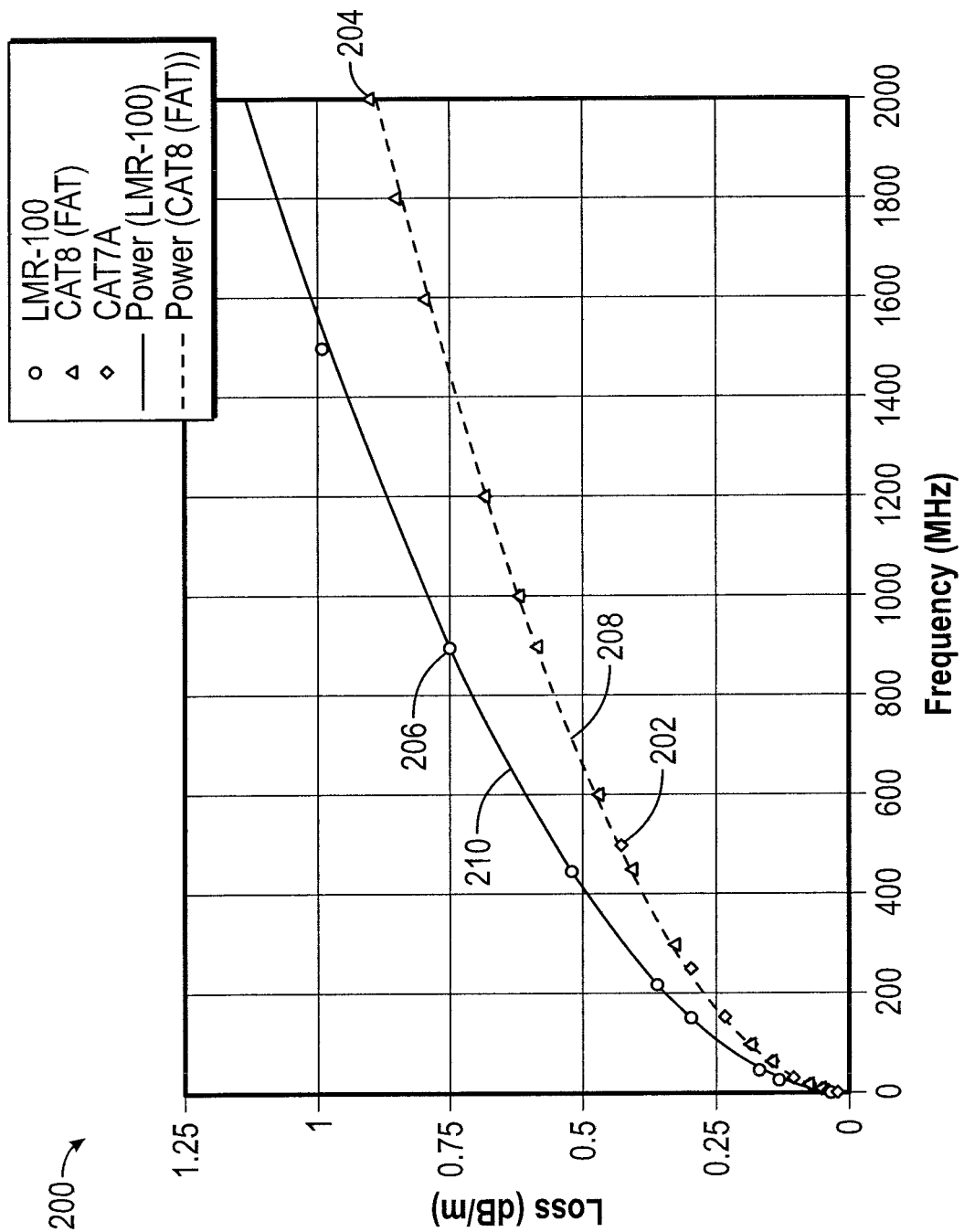
FIG. 2 is a graph showing power/frequency curves for various cables.

FIG. 2 is a chart 200 showing power versus frequency for CAT7A, CAT8, and coaxial LMR-100 cables. Curve 202 shows performance of CAT7A STP cabling. Curve 204 shows performance of CAT8 STP cabling. Curve 206 shows performance of LMR-100 coaxial cable. Curves 208 and 210 show power for CAT8 and LMR-100 cables, respectively. For performance, a CAT7A cable with a 10 meter length has 1 dB less loss than LMR-100 coaxial cable at 433 MHz, and 2 dB less loss than LMR-100 at 1600 MHz. CAT8 cables have similar performance to CAT7A cables, but operate to higher frequencies, 2 GHz or more. Converting from the external balanced lines to unbalanced lines typical of electronic circuits at RF, such as with baluns, reduces common mode conducted interference into the circuit or unwanted common mode emissions out of the circuit.

Figure 3:
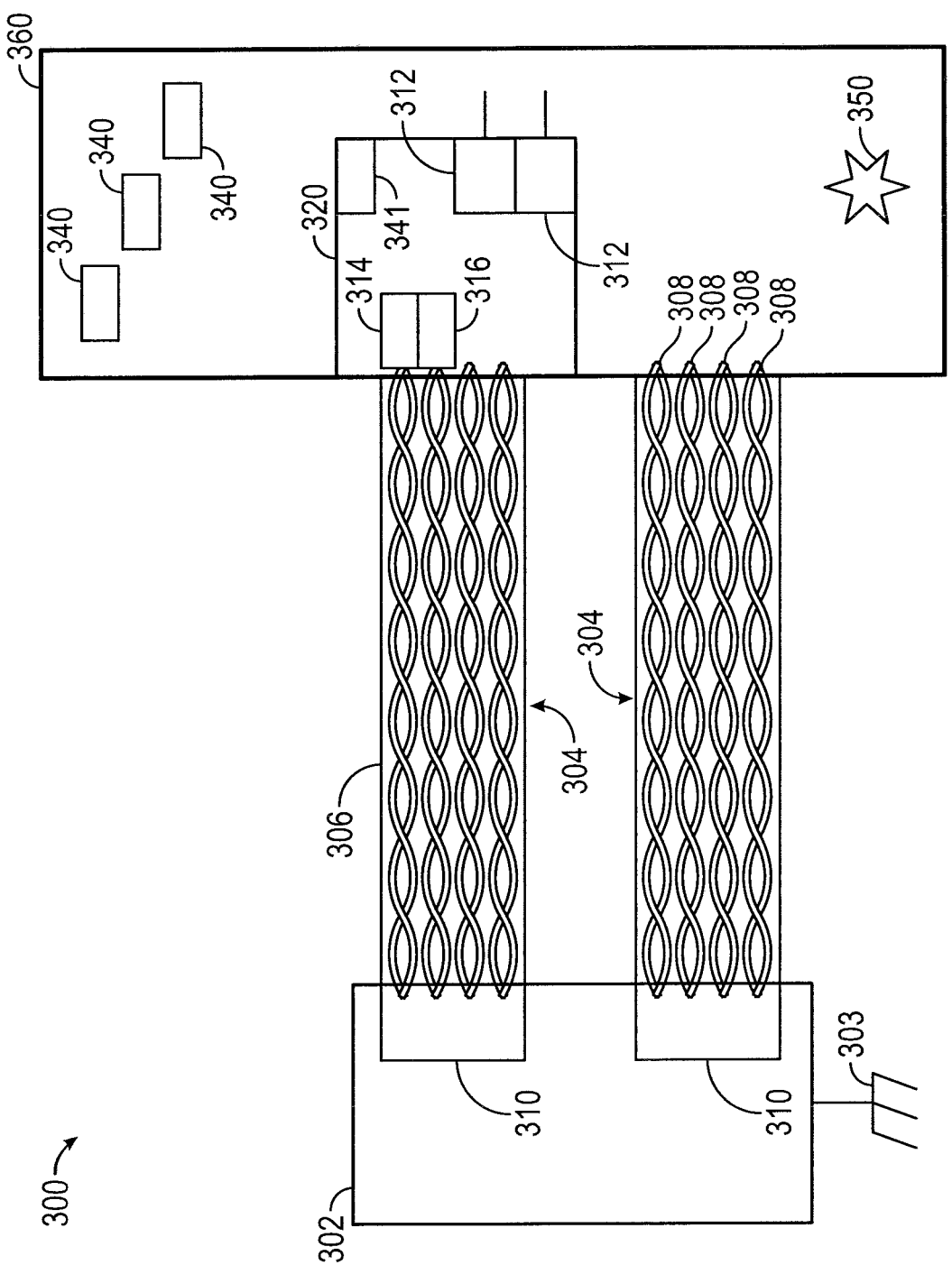
FIG. 3 is a diagram of a sensor system according to an embodiment of the present disclosure.

A sensor system 300 for an electric power asset is shown in block diagram form in FIG. 3. System 300 comprises, in one embodiment, a sensor instrument 302 coupleable to sensors associated with, placed within, or affixed upon an electric power asset 360 to receive sensor signals therefrom, and an antenna connection cable(s) 304 coupled to the sensor instrument 302 and an antenna 320. The antenna connection cable 304 in one embodiment includes a cable sheath 306, and a plurality of twisted pair signal carriers 308 contained within the cable sheath 306. The sheath is in one embodiment conductively coupled to the metal earth grounds of the electrical power asset and of the instrument. The twisted pair signal carriers 308 carry sensor signals transmitted to or received from the electric power asset. In one embodiment, the cable 304 couples to the sensor interface using a CAT6A or similar Ethernet connector 310. Sensor instrument 302 is coupleable to at least one power asset, or to various signals from a power asset, using suitable connectors 312.

Preferably antenna 320 comprises an antenna or an antenna array and conductively connected sensors are integrated into the antenna or antenna array. Optionally, conductively coupled sensors may connect to connectors 312. Optionally, passive wireless sensors 340 measuring the properties of electrical asset 360 are interrogated by signals transmitted by antenna element 314 with the interrogation result received by antenna element 314. When transmitting and receiving occur simultaneously, as in typical RFID systems, the transceiver is monostatic. When transmission ends and reception occurs after a delay, as is typical of radar systems and passive SAW sensors, the transceiver is bistatic. Optionally, at least one passive, wireless sensor 341 is embedded within antenna 320. Optionally a receive-only functionality within the sensor instrument is coupled by a twisted pair to an antenna element 316 which monitors for radio emissions from partial discharge arcs 350 within the electrical power asset 360.

In one embodiment, the cable 304 has four twisted pairs 308 therein. Configuration for the signals carried by the four twisted pairs may take various configurations. In one embodiment, the twisted pair signal carriers contained within the cable sheath carry sensor signals transmitted to or received from the electric power asset. A subset of the twisted pair signal carriers carries signals for diversity antenna operation. In one embodiment, two twisted pairs are used to carry signals from two different feeds for different polarizations or frequency bands and are used for a diversity antenna configuration. In one embodiment, a first subset of the twisted pair signal carriers carries antenna signals such as for antenna functions. Pairs within the first subset receive signals and may optionally transmit signals. Some of the received signals may be related to radio frequency detection of partial discharge within an electrical asset while others may be related to the sensors in the sensor system. An optional second separate subset of the plurality of twisted pair signal carriers carry signals for alternate partial discharge monitoring. These antenna connections may provide partial discharge monitoring by receiving signals from an antenna feed point or may interrogate passive, wireless sensors by transmitting interrogation signals and receiving interrogation responses. In that embodiment, the two remaining twisted pair signal carriers carry alternative signals for partial discharge monitoring. The alternative partial discharge monitoring signals may include signals from various partial discharge monitoring sensors such as an ultraviolet photodiode and an ultrasonic microphone to monitor partial discharge events or additional antenna elements offering added frequency or spatial diversity. In order to provide proper matching of impedances and isolation from, for example, discharge or other interference events, suitable matching and protection circuitry may also be employed, as one of ordinary skill in the art will recognize and understand.

In another embodiment, an antenna for an electric power asset is part of a sensor system for the electric power asset, the sensor system having a number of sensors coupled to antenna signals and further transferring signals for partial discharge monitoring of the electric power asset onto the cable coupling the antenna to the sensor instrument of the sensor system. A sensor instrument is coupleable to the antenna to receive sensor signals therefrom.

Figure 4:
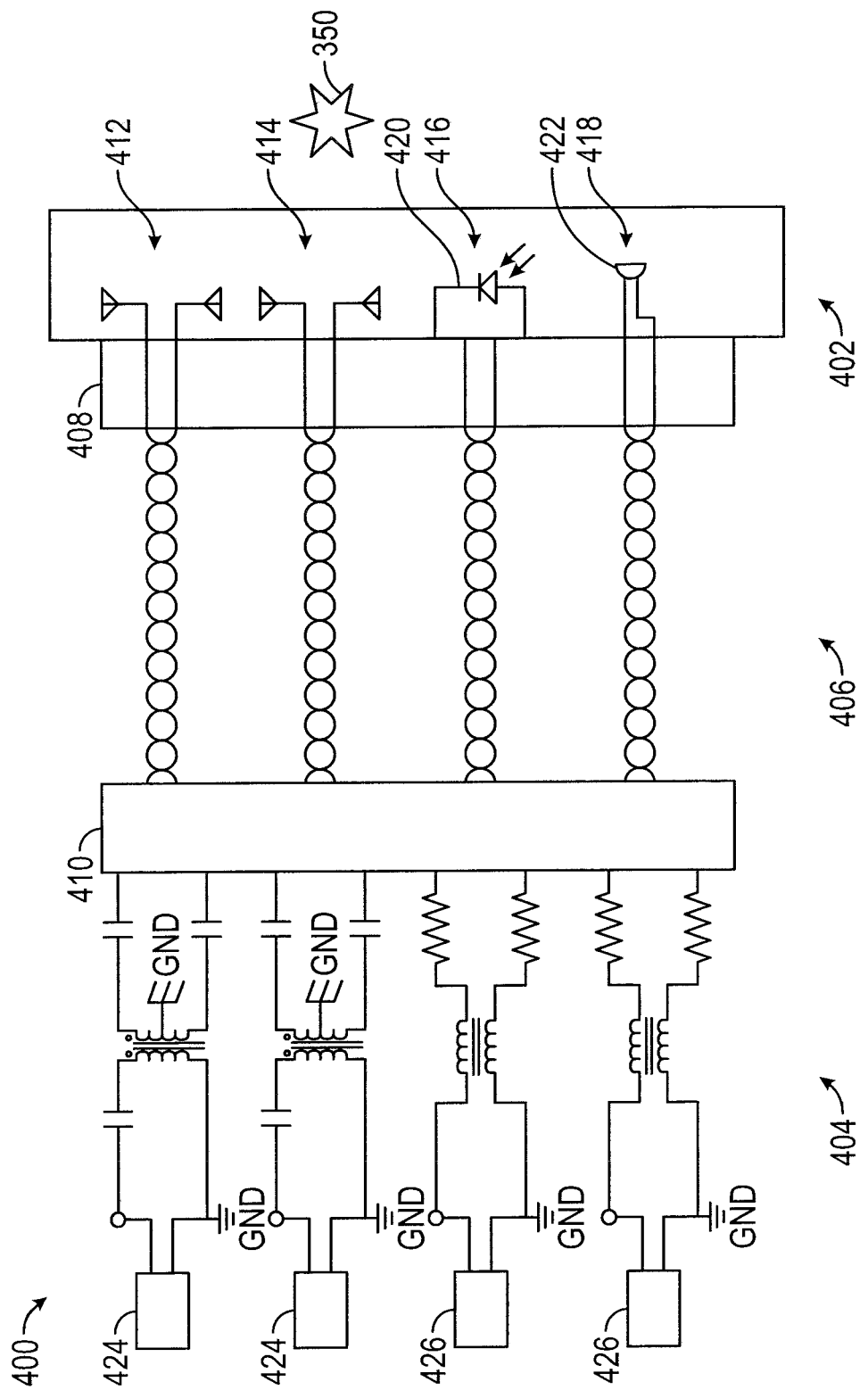
FIG. 4 is a partial circuit diagram of a system according to another embodiment of the present disclosure.

FIG. 4 shows an example of a system 400 such as that described above with respect to FIG. 3, having an antenna side 402 and an instrument side 404 connected via a multiple pair STP cable 406. Connectors 408 and 410 couple the cable 406 to the antenna and instrument sides, respectively. In one embodiment, an antenna such as antenna 320 is employed having additional sensor connections, as described above. In another embodiment, the conductively coupled sensors are enclosed within the antenna 402.

In the embodiment of FIG. 4, two ultrahigh frequency RF channels 412, 414 are each coupled to a twisted pair of cable 406 for UHF antenna activity. These channels may have different feed points, different polarizations, or different frequency bands for diversity antenna operation or may serve different functions. In FIG. 4 antenna element 412 transmits and receives interrogation signals for passive, wireless sensors 340, which may be SAW sensors, RFID sensors, or other sensors, while antenna element 414 passively detects UHF emissions from partial discharge arc 350. The channels are balanced and isolated at instrument side 404 by suitable balancing and protection circuitry 424. It should be understood that different balancing and protection schemes may be employed without departing from the scope of the disclosure. Such balancing and protection schemes are known to those of ordinary skill in the art and are not further described herein.

Also in FIG. 4, channel 416 couples an ultraviolet photodiode sensor 420 to a third twisted pair of cable 406. Channel 418 couples an ultrasonic microphone (e.g., a micro-electro-mechanical "MEMS" sensor) 422 to a fourth twisted pair of cable 406. The channels 416 and 418 are used in this embodiment for partial discharge monitoring using photodiode 420 and microphone 422. Suitable matching and protection circuitry 426 for the partial discharge detection/monitoring elements is employed. It should be understood that different balancing and protection schemes may be employed without departing from the scope of the disclosure. Such balancing and protection schemes are known to those of ordinary skill in the art and are not further described herein.

Figure 5:
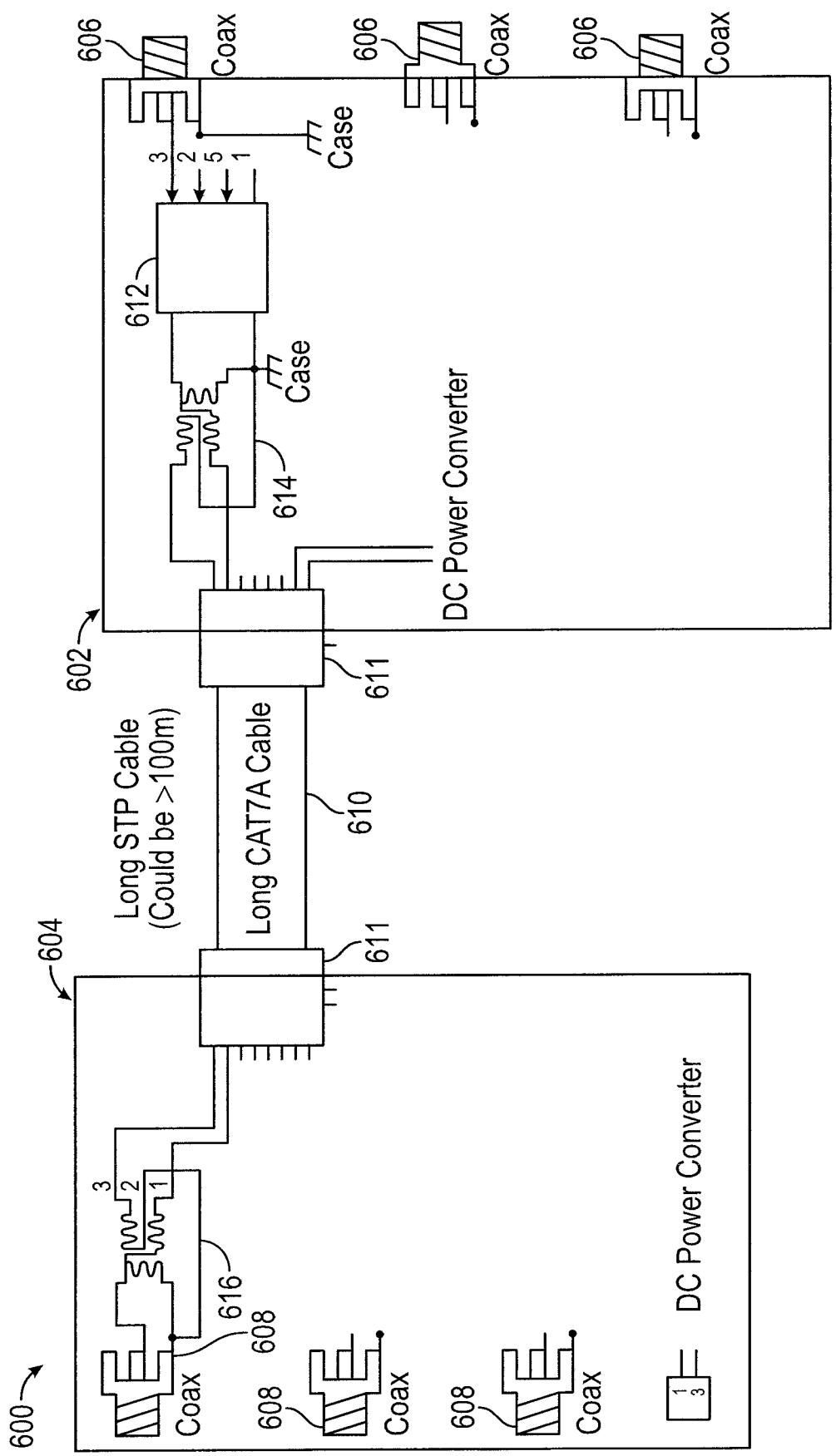
FIG. 5 is a partial circuit diagram of a system according to another embodiment of the present disclosure.
Figure 6:
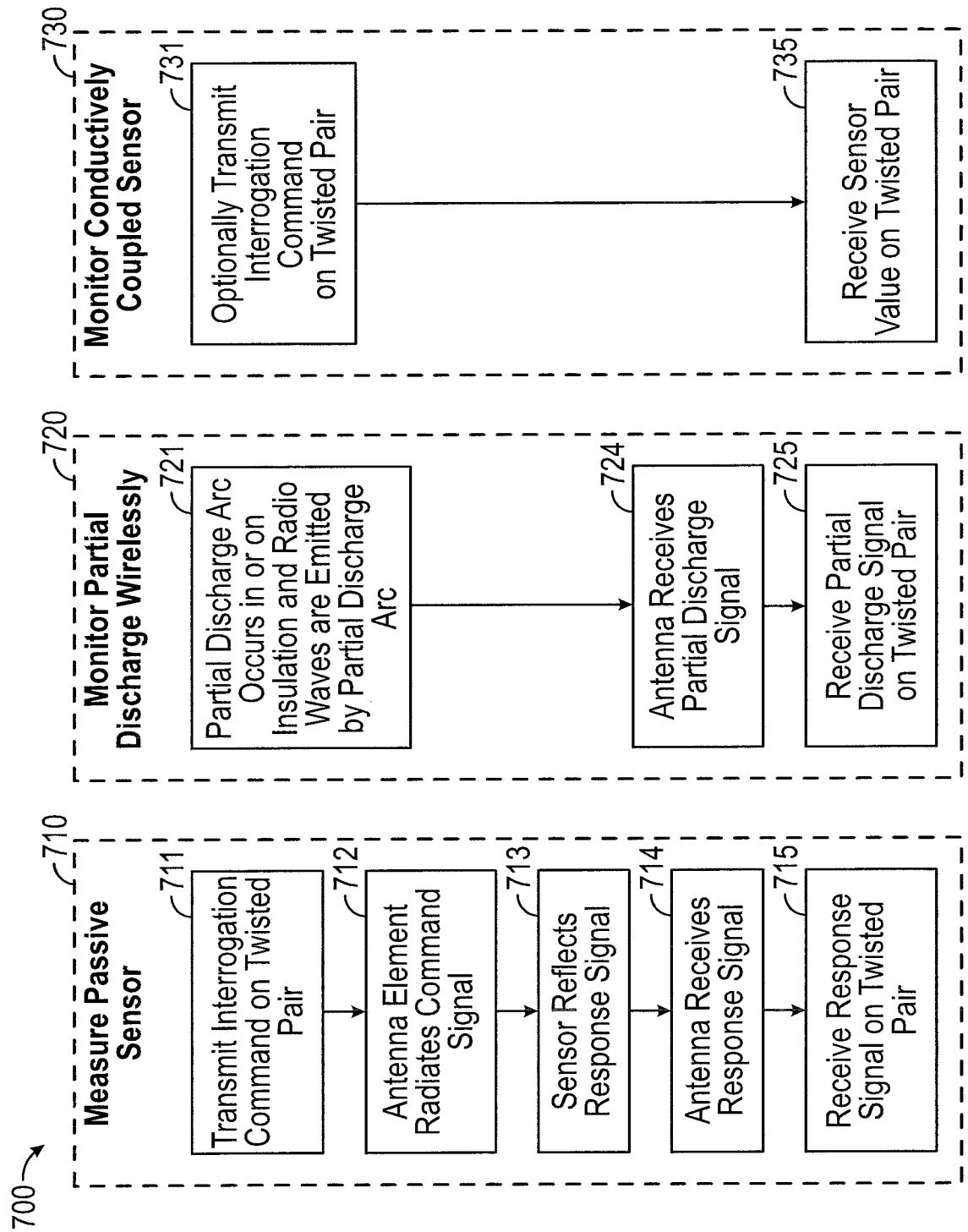
FIG. 6 is a flow chart of a method according to another embodiment of the present disclosure.

FIG. 5 shows an example of a system 600 using a cable such as that described above with respect to FIGS. 1-2, having a long (on the order of 100-200 meters) STP cable connecting electrical assets that employ partial distance monitoring, but that do not have an ability to locally place electronics and an instrumentation panel. In the example as shown in FIG. 6, industrial explosion-proof requirements may place an abnormal cost burden on locating a powered device. The embodiment of FIG. 5 provides two converters, sending unit 602 located at an electric power asset, and receiving unit 604 located near a reader. Each unit 602, 604 has three RF ports 606, 608. The receiving unit 604 uses DC power and transmits power over a UL/ATEX (Underwriters Laboratory/atmosphères explosibles) rated barrier to the remote sending unit 602. Explosion-proof interfaces are provided between the RF ports 606, 608 and a shielded-twisted pair (STP) link cable 610 connected via suitable connectors 611 (in one embodiment, RJ-45 connectors). The sending unit 602 provides DC power to RF preamplifiers 612 (one shown), amplifies partial discharge signals received from the asset through RF ports 606 to mitigate cable losses over the STP link cable 610, and balances with balun 614. With a 20 dB gain preamplifier, cable 610 may extend to lengths of up to 200 meters (assuming 0.1 dB/m attenuation), using attenuators 616 (one shown) at the receiving unit 604 to balance the net gain to 0 dB.

In another embodiment, a method of monitoring an electric power asset includes transmitting and receiving radio frequency antenna signals and receiving partial discharge signals on a multiple-pair shielded twisted pair cable having a plurality of twisted pair signal carriers. Transmitting and receiving include transmitting signals from an instrument for an antenna on a first subset of the plurality of twisted pair signal carriers while receiving a return signal from a sensor on the same plurality of twisted pair signal carriers at the instrument from the antenna. Receiving further includes receiving signals for partial discharge monitoring on a second separate subset of the plurality of twisted pair signal carriers at the instrument from the antenna. Optionally, the same antenna element and twisted pair may transmit and receive signals to measure a sensor at some times and passively receive radio signals related to partial discharge at other times.

FIG. 6 is a flow chart diagram of a method 700 for monitoring an electric power asset. The method sequentially performs one or more of tasks 710 "Measure Passive Sensor", 720 "Monitor Partial Discharge Wirelessly", and 730 "Monitor Conductively Coupled Sensors". Task 710 has steps 711 transmitting radio frequency interrogation signals on the twisted pair, 712 radiate interrogation signals from antenna element, 713 reflect response signal from sensor, 714, receive response signal by antenna, and 715 receive response signal on twisted pair. Task 720 has steps 721 wherein partial discharge arc occurs and radio waves are emitted, 724 wherein an antenna receives partial discharge signals, and 725 wherein an instrument receives partial discharge signals on twisted pair. Task 730 has steps 731 to optionally transmit interrogation command and 735 to receive sensor value on twisted pair. Step 731 would not be required for analog sensors that constantly send a measurement or for digital devices that do not require an interrogation command. Interrogated sensors might measure ultraviolet light or ultrasonic emissions of the partial discharge that accompany radio wave emissions or might measure humidity or other operational and environmental conditions.

Transmitting signals for an antenna further comprises in one embodiment transmitting balanced radio frequency antenna signals from an instrument to an antenna of the electric power asset to allow diversity antenna operation for the antenna of the electric power asset. Transmitting signals allowing diversity antenna operation may comprise transmitting signals using a plurality of feed points of an antenna or antenna array of the electric power asset, transmitting signals from a plurality of feed points having different frequency bands for an antenna of the electric power asset, transmitting signals from a plurality of feed points having different polarizations for an antenna or antenna array of the electric power asset, transmitting signals using a different resonance for an antenna of the electric power asset, transmitting signals from a different type of radiator for an antenna of the electric power asset, or the like. In one embodiment, transmitted signals from the instrumentation interrogate passive, wireless sensors. The return signal from such sensors is then received and returned to the instrument.

Receiving signals for partial discharge wireless monitoring further comprises in one embodiment receiving balanced radio frequency antenna signals by the instrument from an element of an antenna of the electric power asset to allow diversity antenna operation for an antenna of the electric power asset. Receiving signals allowing diversity antenna operation may comprise receiving signals using a plurality of feed points of an antenna or antenna array of the electric power asset, receiving signals from a plurality of feed points having different frequency bands for an antenna of the electric power asset, receiving signals from a plurality of feed points having different polarizations for an antenna or antenna array of the electric power asset, receiving signals using a different resonance for an antenna of the electric power asset, receiving signals from a different type of radiator for an antenna of the electric power asset, or the like. Such interrogations may be time-interleaved with transmitting and receiving passive sensor signals or may occur on distinct and separate twisted pairs of the cable.

Partial discharge control signals that may be transmitted and sensor signals that may be received on the second subset of the plurality of twisted pair signal carriers include by way of example only, and not by way of limitation, a photodetection signal from a photoelectric partial discharge monitor of the electric power asset, and/or an audio signal from a microphone-based partial discharge monitor of the electric power asset. Further twisted pairs of the second subset of the plurality of twisted par signal carriers may transmit temperature and humidity signals.

Although the present embodiments have been described with specificity, workers skilled in the art will recognize that changes may be made in form and detail without departing from the scope of the disclosure. Although the subject matter has been described in language directed to specific environments, structural features and/or methodological acts, it is to be understood that the subject matter defined in the appended claims is not limited to the environments, specific features or acts described above as has been held by the courts. Rather, the environments, specific features and acts described above are disclosed as example forms of implementing the claims.

The forgoing discussions address a first and a second subset and it should be obvious to the reader that the order of discussion is immaterial. Throughout the discussion above and the claims below, the first subset that is discussed in the context of that paragraph is the "first subset" and thereafter subsets are described as they appear in the paragraph or claim.

What is claimed is:

1. A sensor system for an electric power asset, comprising:
    a sensor instrument including a first antenna configured to wirelessly couple to a standing acoustic wave (SAW) sensor associated with the electric power asset to receive sensor signals therefrom and a second antenna configured to receive a radio frequency signal from the electrical power asset indicative of a partial discharge; and
    an antenna connection cable coupled to the first antenna and the second antenna of the sensor instrument, the antenna connection cable comprising:
        a cable sheath; and
        a plurality of twisted pair signal carriers contained within the cable sheath to carry sensor signals received from the electric power asset comprising a first twisted pair coupled to the first antenna and a second twisted pair coupled to the second antenna;
        wherein a first twisted pair of the plurality of twisted pair signal carriers carry antenna signals from the first antenna and a second separate twisted pair of the plurality of twisted pair signal carriers carry signals from the second antenna for partial discharge monitoring.

2. The sensor system of claim 1, wherein the first twisted pair of twisted pair signal carriers comprise balanced radio frequency antenna signals between an external instrument and an antenna of the electric power asset.

3. The sensor system of claim 1, wherein the first twisted pair of twisted pair signal carriers carries signals to allow diversity antenna operation between an external instrument and an antenna of the electric power asset.

4. The sensor system of claim 3, wherein each of the first twisted pair of twisted pair signal carriers carries a signal between an external instrument and a different feed point for an antenna of the electric power asset.

5. The sensor system of claim 1, wherein each of the first twisted pair of twisted pair signal carriers carries a signal between an external instrument and an antenna feeding a different frequency band for an antenna of the electric power asset.

6. The sensor system of claim 1, wherein each of the first twisted pair of twisted pair signal carriers carries a signal having a different polarization between an external instrument and an antenna of the electric power asset.

7. The sensor system of claim 1, wherein each of the first twisted pair of twisted pair signal carriers carries a signal using a different resonance for an antenna of the electric power asset.

8. The sensor system of claim 1, wherein each of the first twisted pair of twisted pair signal carriers carries a signal from a different type of radiator for an antenna of the electric power asset.

9. The sensor system of claim 1, wherein the sensor instrument comprises different coupler types for different connections to the electric power asset.

10. The sensor system of claim 1, wherein at least one twisted pair of the second twisted pair of twisted pair signal carriers carries a photodetection signal from a photoelectric partial discharge monitor of the electric power asset.

11. The sensor system of claim 1, wherein at least one twisted pair of the second twisted pair of twisted pair signal carriers carries an audio signal from a microphone-based partial discharge monitor of the electric power asset.

12. The sensor system of claim 1, wherein at least one twisted pair of the second twisted pair of twisted pair signal carriers carries a humidity signal.

13. The sensor system of claim 1, wherein at least one twisted pair of the second twisted pair of twisted pair signal carriers carries an ambient temperature signal.

14. A method of monitoring an electric power asset for partial discharge, comprising:
    receiving partial discharge signals on a multiple-pair, shielded twisted pair cable having a plurality of twisted pair signal carriers, wherein receiving comprises:
    receiving partial discharge radio frequency emission signals on a first twisted pair of the plurality of twisted pair signal carriers from a first antenna; and
    wirelessly transmitting control signals and wirelessly receiving sensor signals from a standing wave acoustic sensor for partial discharge monitoring on a second separate twisted pair of the plurality of twisted pair signal carriers coupled to a second antenna.

15. The method of claim 14, wherein transmitting antenna signals further comprises transmitting balanced radio frequency antenna signals for an antenna of the electric power asset to allow diversity antenna operation for an antenna of the electric power asset.

* * * * *